United States Patent [19]
Myers et al.

[11] Patent Number: 5,169,132
[45] Date of Patent: Dec. 8, 1992

[54] WORKPIECE HANDLER

[75] Inventors: Charles C. Myers, Pleasant Valley; James E. Spence, LaGrangeville, both of N.Y.

[73] Assignee: International Business Machines Corporation, Armonk, N.Y.

[21] Appl. No.: 853,194

[22] Filed: Mar. 18, 1992

[51] Int. Cl.⁵ .............................................. B23P 19/00
[52] U.S. Cl. ..................................... 269/6; 269/157; 269/233; 269/903
[58] Field of Search .................. 29/758, 760, 764, 278, 29/268; 269/6, 233, 903, 157, 34, 292; 254/93 R

[56] References Cited

U.S. PATENT DOCUMENTS

| | | | |
|---|---|---|---|
| 662,535 | 11/1900 | Jenkins | 269/6 |
| 3,190,216 | 6/1965 | Keller | 269/233 |
| 3,742,571 | 7/1973 | Brehm | 29/278 |
| 4,244,618 | 1/1981 | Boyer et al. | |
| 4,278,015 | 7/1981 | Weaver | |
| 4,377,907 | 3/1983 | Bertellotti | |
| 4,386,461 | 6/1983 | Plummer | 29/758 |
| 4,437,648 | 3/1984 | Thorn et al. | 254/93 R |
| 4,446,609 | 5/1984 | Bredow | 29/278 |
| 4,529,182 | 7/1985 | Valentine | |
| 4,618,131 | 10/1986 | Campisi et al. | 29/760 |
| 4,911,490 | 3/1990 | Akagawa | |

OTHER PUBLICATIONS

M. Sorokac, "Air-Operated Parallel Gripper Mechanism for Robots," IBM Technical Disclosure Bulletin BC 882-0322, vol. 27, No. 3, Aug. 1984.
H. Poweleit, "Robotic Gripper with the IBM System 7576," IBM Technical Disclosure Bulletin, FI8880111, vol. 32, No. 4A, Sep. 1989.
D. W. Decker, et al., "Substrate Gripper," Technical Disclosure Bulletin FI889-0532, vol. 33, No. 10A, Mar. 1991.
J. Spence, "Variable Pneumatic Substrate Grippers," Research Disclosure, Jul. 1991, No. 327.
N. Sasaki, "Compliant Robot Gripper for Circuit Card Insertion and Removal," IBM Technical Disclosure Bulletin JA889-1076, vol. 33, No. 3A, Aug. 1990.

*Primary Examiner*—Robert C. Watson
*Attorney, Agent, or Firm*—Richard Lau

[57] ABSTRACT

Substrate handling apparatus includes a trigger handle which forms a trigger-like mechanism with a handle grip. The trigger handle is interconnected with activation means such that application of pressure on the trigger handle activates the activation means.

11 Claims, 4 Drawing Sheets

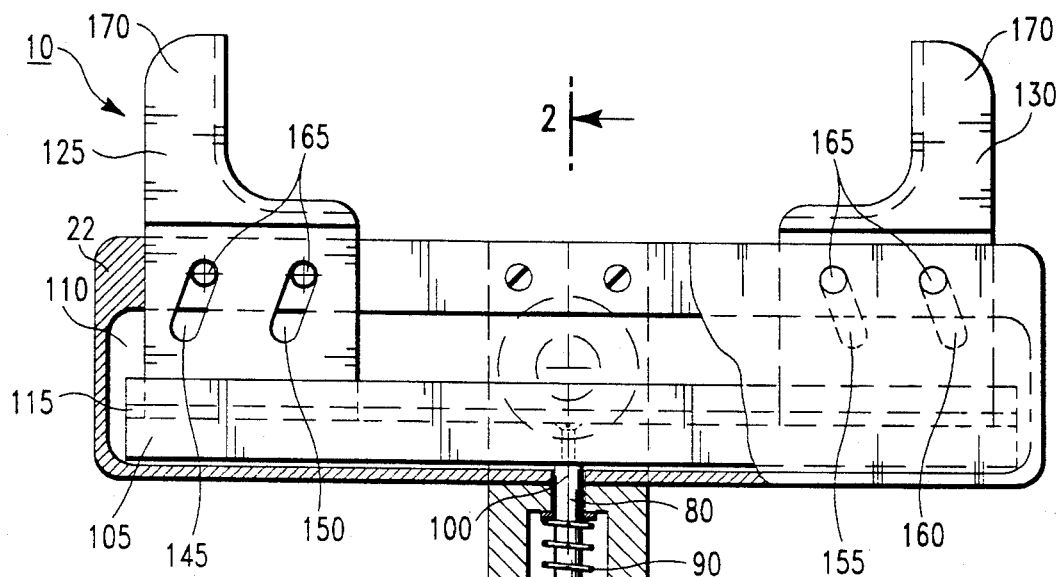
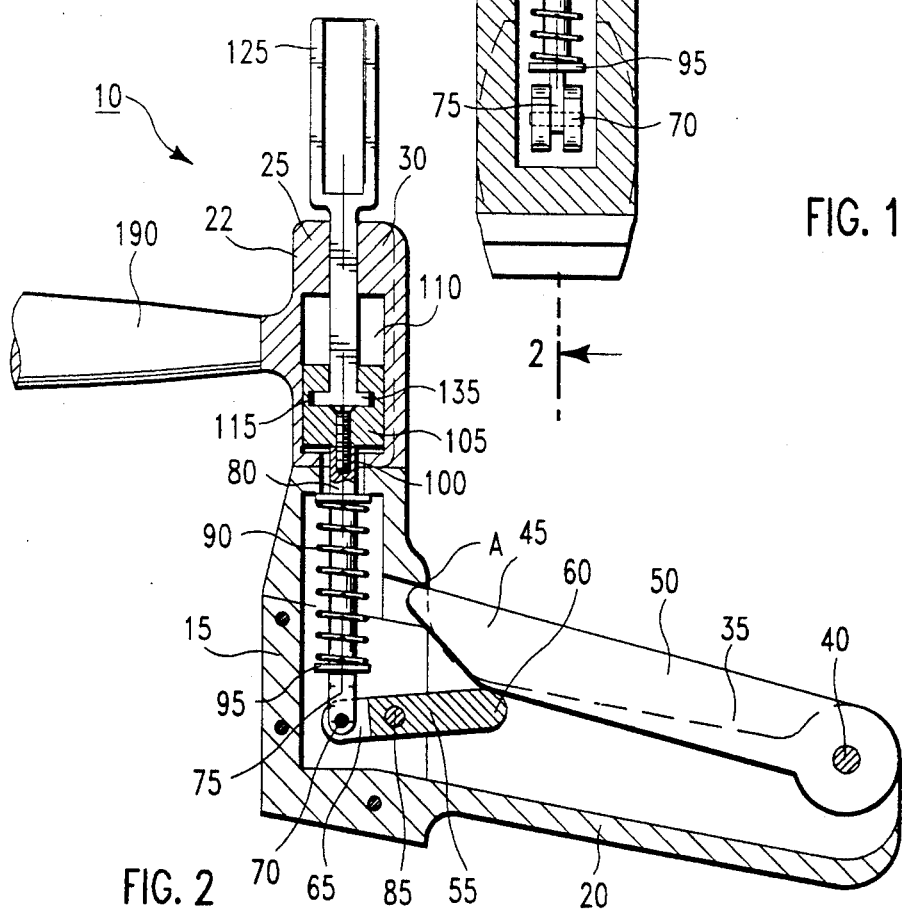
FIG. 1
FIG. 2

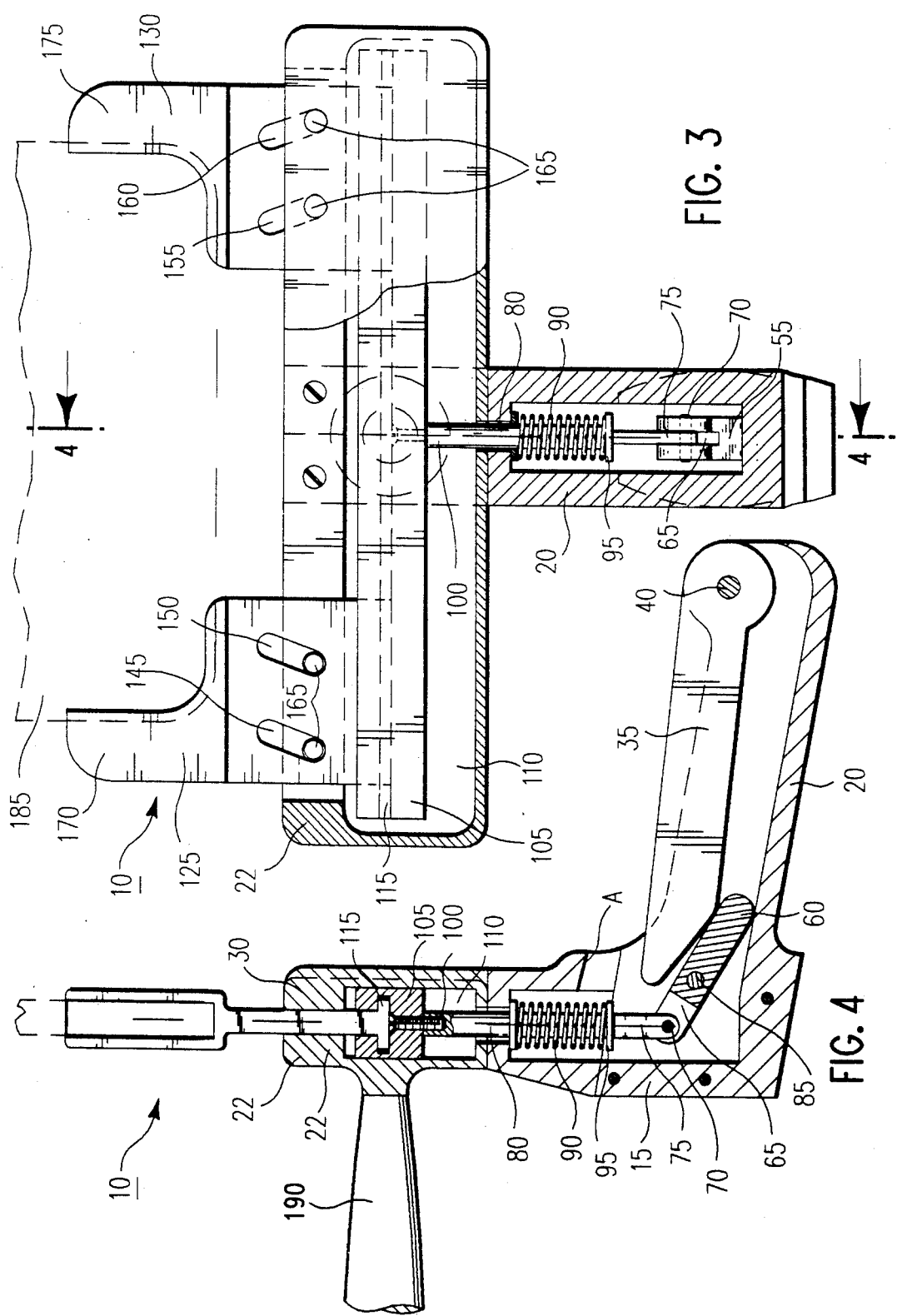

WORKPIECE HANDLER

TECHNICAL FIELD

The present invention relates generally to workpiece holders or handlers and, more particularly, to a holder or handler for holding substrates, wafers, fixtures, circuit cards, etc.

BACKGROUND OF THE INVENTION

During manufacturing and testing of semiconductor substrates, it is required for the substrates to be frequently handled for conducting the various process steps, and for transporting or transferring the substrates from one process step to another. In clean room environments, such handling is generally performed using either a manually or pneumatically operated handling tool. Unfortunately, conventional substrate handling tools commercially available on the market today are typically inadequate and ineffective. This is particularly true in the handling of today's relatively larger sized, heavier substrates. As an example, present day substrates may be as large as 200 mm, or more, and as heavy as 5 pounds, or more. In this regard, conventional handling tools either lack the capability to adequately handle present day substrates, or such tools do not allow a user to properly control and maneuver the substrates in performing the various required processes. Frequently, the inadequacies of the handling tool causes the substrate to be dropped, thus resulting in irreparable damage to the substrate or contaminating of the substrate.

Accordingly, there remains a need for a substrate handling tool which is easy to operate, suitable for use in clean room environments, capable of adequately handling relatively large, heavy substrates, and which allows for handling of substrates with ample controllability and maneuverability.

SUMMARY OF THE INVENTION

It is therefore one object of the present invention to provide a new and improved substrate handling tool.

Another object of the present invention is to provide a substrate handling tool which is simple to operate.

Still another object of the invention is to provide a substrate handling tool which is usable in clean room environments.

A further object of the invention is to provide a substrate handling tool which is capable of handling large, heavy substrates.

Yet another object of the present invention is to provide a substrate handling tool which allows for handling substrates with ample controllability and maneuverability.

In order to accomplish the above and other objects of the invention, a substrate handling apparatus includes a frame having a handle grip extending therefrom. Two clamps are mounted in the frame. Each clamp has a clamping portion which extends from the frame, and each clamp is movable from a reset position to a clamping position. Activation means are disposed in the frame and interconnected with the clamps. The activation means is activatable for controlling movement of the clamps from the reset position to the clamping position. Further, a trigger handle is interconnected with the activation means such that application of pressure on the trigger handle activates the activation means. The trigger handle forms a trigger-like mechanism with the handle grip, such that gripping of the handle grip and application of pressure on the trigger handle can be simultaneously accomplished with one-hand operation.

BRIEF DESCRIPTION OF THE DRAWINGS

These and other objects, features, aspects and advantages will be more readily apparent and better understood from the following detailed description of the invention, in which:

FIG. 1 shows a top partial cross-sectional view of a handling apparatus in the reset position in accordance with the present invention;

FIG. 2 shows a side cross-sectional view taken along line 2—2 of the handling apparatus of FIG. 1;

FIG. 3 show a top partial cross-sectional view of a handling apparatus in the activated position in accordance with the present invention;

FIG. 4 shows a side cross-sectional view taken along line 4—4 of the substrate handling apparatus of FIG. 3;

DETAILED DESCRIPTION OF THE PREFERRED EMBODIMENTS

Figure 5:
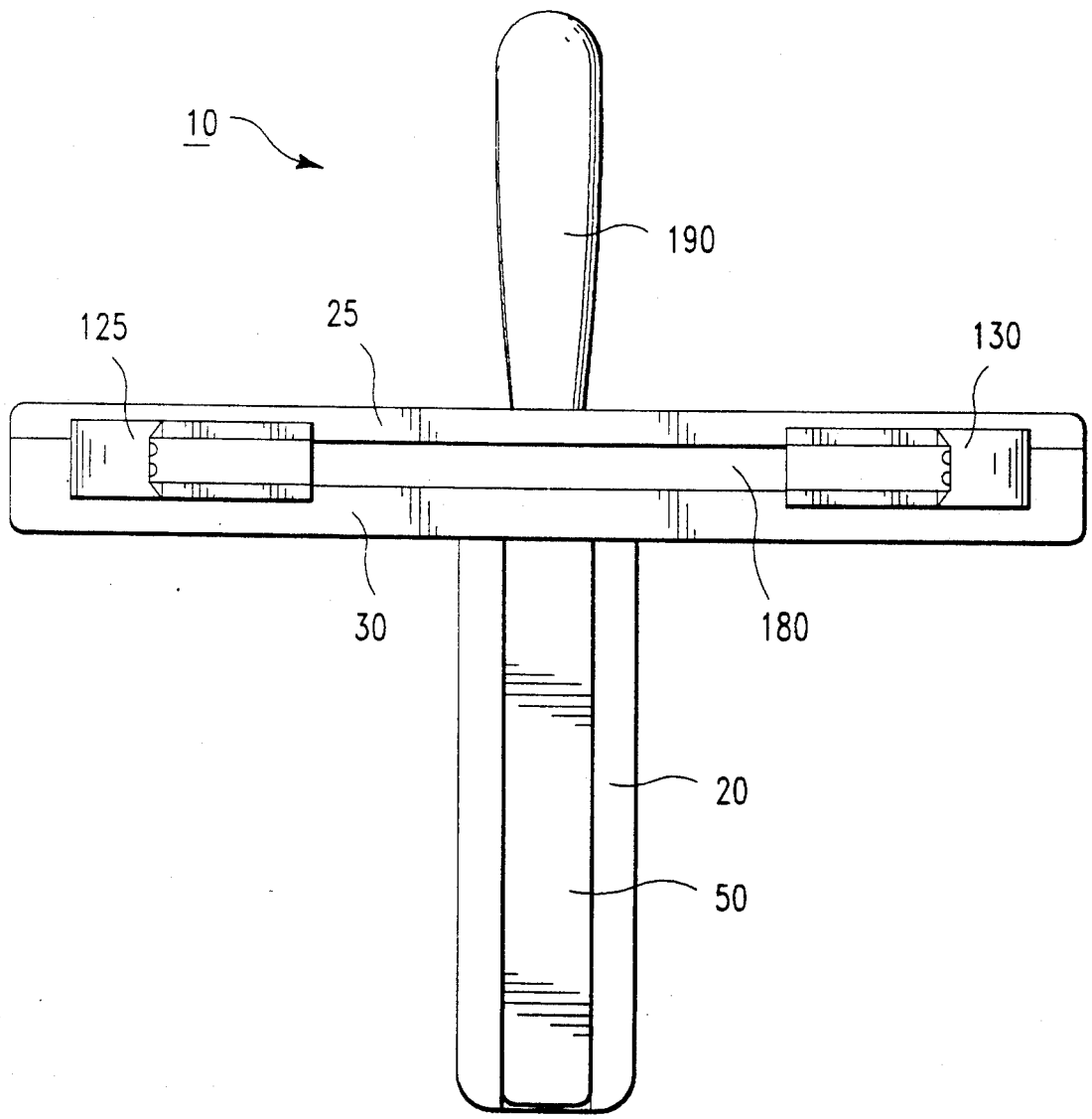
FIG. 5 shows a front view of the handling apparatus in accordance with the invention.

Referring to the drawings, there is shown a manually operated substrate handling tool 10. The tool 10 includes a main frame 15, a handle grip 20 and a covering frame 22. Preferably, the covering frame 22 comprises an upper cover portion 25 and lower cover portion 30. Note that the handle grip 20 extends from the main frame 15 at an angle of about 90 degrees.

A trigger handle 35 is mounted in the handle grip 20 and pivotable about a handle pin 40. The trigger handle 35 is compressible and movement of the trigger handle 35 is limited by abutment of an end portion 45 of the handle 35 against point A of the main frame 15. Further, a portion 50 of the trigger handle 35 extends beyond the handle grip 20 so as to form a trigger-like mechanism with the handle grip 20.

An activation rod 55 has a first rod end 60 which bears against the trigger handle 35, and a second rod end 65 which is pivotably connected by shaft pin 70 to the first shaft end 75 of shaft 80. The activation rod 55 is also pivotable about a rod pin 85.

The shaft 80 extends through the main frame 15, and is spring-loaded. More specifically, the shaft is centrally disposed within a spring 90, and along the longitudinal axis of the spring 90. A retaining ring 95 is mounted around the shaft 80 so that the spring 90 is confined between and seated on the retaining ring 95 and the main frame 15. The spring 90 maintains the handling tool 10 in a reset position until activated, and returns the tool 10 to the reset position after activation. The shaft 80 also has a second shaft end 100 which is affixed to a block guide 105. The block guide 105 is slidably disposed within a chamber or cavity 110 formed by the upper cover portion 25 and lower cover portion 30. The shaft 80 may be affixed to the block guide 105 and adapted to reciprocate therein by any conventional means, for instance by using a screw, glue, or the like.

Figure 7A:
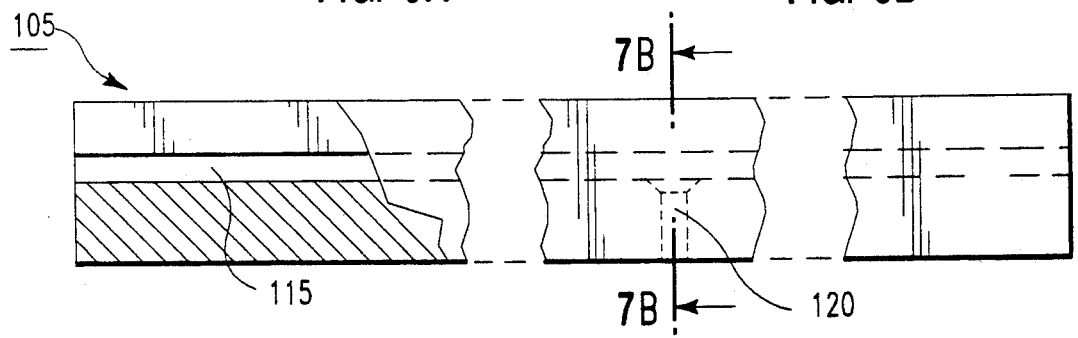
FIG. 7(A)-(B) show top and side views, respectively, of a block guide in accordance with the present invention.
Figure 7B:
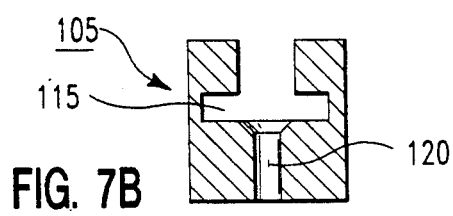

The block guide 105, more specifically shown in FIGS. 7A-B, has a "T-shaped" groove 115 extending along its length, and may also include a blind hole 120 which allows for the shaft 80 to be affixed to the block guide 105.

Figures 6A, 6B:
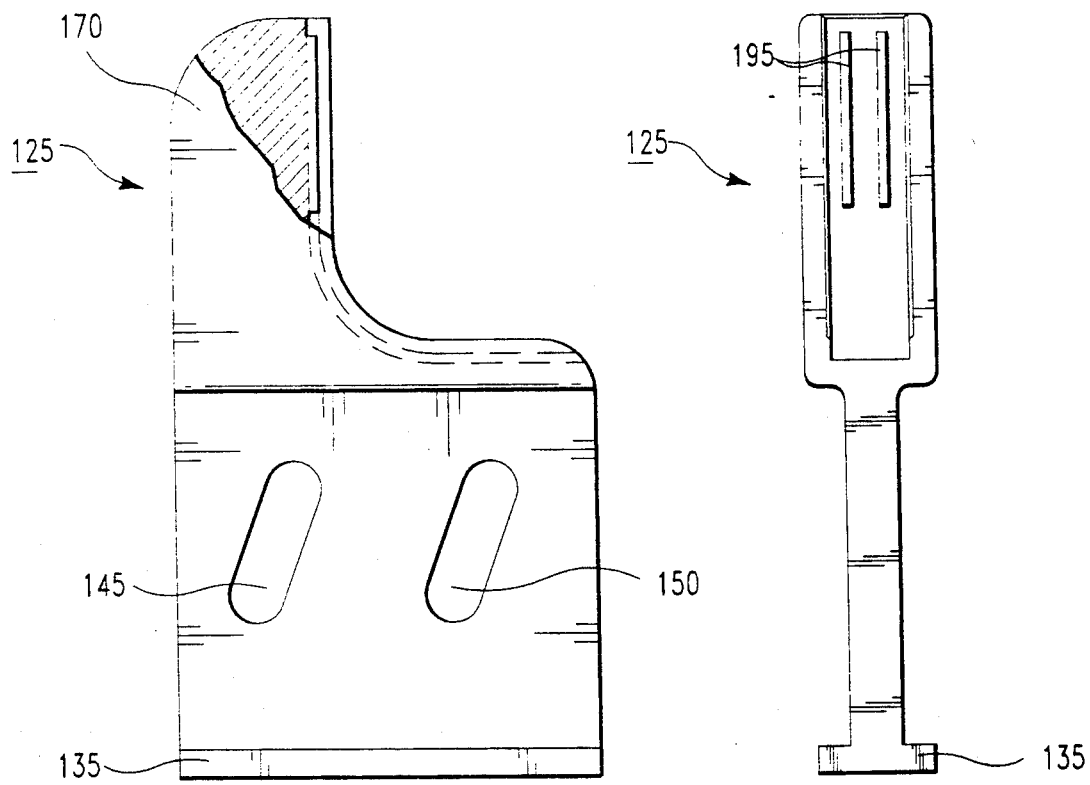
FIGS. 6(A)-(B) show top and side views, respectively, of a clamp in accordance with the present invention.

Clamps 125, 130, one of which is more specifically shown in FIGS. 6A-B, each have a "T-shaped" end portion 135, 140, respectively, which slidably fit into the "T-shaped" groove 115 of the block guide 105.

Each of the clamps 125, 130 also has a pair of obliquely or diagonally oriented slots 145, 150 and 155, 160, respectively, and each of the slots 145-160 is slidingly engaged with a corresponding respective clamp pin 165. As the slots 145-160 extend further away from the "T-shaped" (in cross-section) end portions 135, 140, the slots 145, 150 of clamp 125 are oriented so as to slant toward clamp 130, and the slots 155, 160 of clamp 130 are oriented so as to slant toward clamp 125. Further, one end portion of each of the clamp pins 165 is affixed to the upper cover portion 25, and the other end portion of each of the clamp pins 165 is affixed to the lower cover portion 30. Each of the clamps 125, 130 also has a clamping end portion 170, 175, respectively, which extends through an elongated slit or opening 180 formed by the upper cover portion 25 and lower cover portion 30, as shown in FIG. 6. The opening 180 should be of adequate dimensions such that the clamps 125, 130 can freely slide along the length of the opening 180, and freely move in and out of the opening 180.

In operation, the handling tool 10 is operated by depressing or applying pressure on the trigger handle 35. Application of pressure on the trigger handle 35 causes the activation rod 55 to rotate or pivot about the rod pin 85. The activation rod 55 is pivotably connected to the shaft 80 by the shaft pin 70 such that the pivoting of the activation rod 55 translates into linear or straight-line forward movement of the shaft 80 toward the cover portions 25, 30. As the shaft 80 moves forward, the spring 90 compresses, and the block guide 105 is urged forward within the chamber 110 by the shaft 80. Since the T-shaped end portions 135, 140 of the clamps 125, 130 are fittedly disposed in the T-shaped groove 115 of the block guide 105, the clamps 125, 130 move in conjunction with the forward movement of the block guide 105. Movement of the clamps 125, 130 is dictated and controlled by the T-shaped groove 115, and by the sliding engagement of the clamp pins 165 within the obliquely oriented slots 145-160. More specifically, as the block guide 105 moves in a forward direction, the clamps 125, 130 not only move forward, but also slide toward each other along the groove 115 as directed by the sliding engagement of the clamp pins 165 along the obliquely oriented slots 145-160. Accordingly, as the clamps 125, 130 move toward one another, a substrate or workpiece 185 can be securely held in position between the clamping end portions 170, 175 of the respective clamps 125, 130. Moreover, maintaining adequate pressure on the trigger handle 35 will retain the workpiece 185 between the clamps 125, 130.

It is important to note that the handling tool 10 of the present invention is ergonomically designed for ease of operation, control and handling. Particularly, the trigger handle 35 forms a trigger-like mechanism with the handle grip 20, thus providing for maximum controllability and maneuverability when handling a workpiece. Moreover, gripping of the handle grip 20 and application of pressure on the trigger handle 35 can readily be simultaneously accomplished using one-hand.

In regard to present day larger sized, heavier workpieces or substrates, an optional top grip 190 can be affixed to the upper cover portion 25. Preferably, the top grip 190 should extend from the upper cover portion 25 at an angle of about 90 degrees. This top grip 190 will allow a user to hold and activate the handling tool 10 with one hand at the handle grip 20 and trigger handle 35, while simultaneously gripping or holding the top grip 190 with the other hand, thus providing additional support and control when handling the larger, heavier substrates. If desired, the top grip 190 can be affixed to the upper cover portion 25 in a removable manner. Affixation of the top grip 190 to the upper cover portion 25 can be achieved by any conventional means, for example an internally threaded section can be provided in the top grip 190 which appropriately mates with an externally threaded section provided on the upper cover portion 25.

Another advantageous feature of the present invention is that the tool 10 can be designed for ready disassembly for versatility purposes. In this regard, the main frame 15, handle grip 20, upper cover portion 25 and lower cover portion 30 can comprise separate individual components which are integrally connected to one another, such as by mounting pins, screws, or the like. Disassembly allows for replacing of any component that may fail, and also allows for replacing or interchanging of the clamps 125, 130. In this regard, various clamps of different size and material can be manufactured to suit the particular needs and applications of a user. For example, clamps with different sized clamping end portions can be provided so as to allow for interchanging of the clamps for handling of various sized substrates. Further, the clamps can be constructed of material which is appropriate for clean room environments. Such material may include polypropylene, or Teflon or Delrin, which are trademarks for products manufactured by E. I. DuPont Nemours, Co., of Wilmington, Del. Of course, the material used to construct the other components of the handling tool 10 can also be selected to suit particular applications as required by a user.

Moreover, in order to provide for increased non-slip, protective clamps, the surfaces of the clamping end portions that contact the workpiece can be provided with a liner 195 of suitable material. As an example, the liner 195 can comprise a plurality of strips mounted on each clamp, and the material used to construct the liner 195 can be rubber, foam, soft plastic, or the like. Furthermore, the liner 195 can be made to be removable and replaceable.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. Substrate handling apparatus, comprising:
 a frame having a handle grip extending therefrom;
 two clamps mounted in said frame, each clamp having a clamping portion extending from said frame, and each clamp being movable from a reset position to a clamping position;
 activation means disposed in said frame, interconnected with said clamps, and activatable for controlling movement of said clamps from the reset position to the clamping position; and a trigger handle forming a trigger-like mechanism with said handle grip, and being interconnected with said activation means such that application of pressure on said trigger handle activates said activation means;

said activation means comprising:

an activation rod bearing against said trigger handle, and pivoting in response to application of pressure on said trigger handle;

a shaft being connected to said activation rod such that pivoting of said activation rod translates into linear forward movement of said shaft; and a guiding piece being affixed to said shaft, and in mutual engagement with said clamps, said guiding piece being urged forward in response to the linear forward movement of said shaft, whereby the forward movement of said guiding piece causes the clamps to move from the reset position to the clamping position.

2. Substrate handling apparatus according to claim 1, wherein pressure is manually applied on said trigger handle.

3. Substrate handling apparatus according to claim 2, wherein holding of said handle grip and application of pressure on said trigger handle can be simultaneously accomplished with one-hand operation.

4. Substrate handling apparatus according to claim 1, wherein said handle grip extends at about a 90 degree angle from said frame.

5. Substrate handling apparatus according to claim 1, further including reset means which maintains said clamps in the reset position until activated by said activation means.

6. Substrate handling apparatus according to claim 1, wherein said shaft is spring-loaded so as to maintain said clamps in the reset position until activated by said activation means.

7. Substrate handling apparatus according to claim 1, wherein said clamps are in sliding engagement with said guiding piece.

8. Substrate handling apparatus according to claim 1, wherein each of said clamps includes at least one slot, each slot being in sliding engagement with a corresponding affixed pin, and each slot being obliquely oriented such that forward movement of said clamps is accompanied by movement of said clamps toward each other.

9. Substrate handling apparatus according to claim 1, wherein said clamps are replaceable.

10. Substrate handling apparatus according to claim 1, further comprising a second handle grip affixed to said frame and extending at about a 90 degree angle from said frame.

11. Substrate handling apparatus according to claim 1, wherein said second handle grip is removable from said frame.

* * * * *